United States Patent
Metzger et al.

(10) Patent No.: US 6,169,291 B1
(45) Date of Patent: Jan. 2, 2001

(54) UNIMOLECULAR ORGANIC RECTIFIER OF ELECTRICAL CURRENT

(75) Inventors: Robert M. Metzger, Northport; Bo Chen, Tuscaloosa, both of AL (US)

(73) Assignee: The University of Alabama, Tuscaloosa, AL (US)

( * ) Notice: Under 35 U.S.C. 154(b), the term of this patent shall be extended for 0 days.

(21) Appl. No.: 09/089,164

(22) Filed: Jun. 2, 1998

(51) Int. Cl.[7] ............................................. H01L 51/00
(52) U.S. Cl. ................................ 257/40; 257/613; 438/99
(58) Field of Search ............................ 257/40, 613; 438/99

(56) References Cited

U.S. PATENT DOCUMENTS 3,953,874  4/1976  Aviram et al. .
5,152,805  10/1992  Geddes et al. .

OTHER PUBLICATIONS

Aviram, et al., Chem. Phys. Lett. 29, 277–283 (1974).
Metzger, Mater. Sci. & Eng. Rg. C3, 277–285 (1995).
Geddes, et al., J. Appl. Phys. 71, 756–768 (1992).
Martin, et al., Phys. Rev. Lett. 70, 218–221 (1993).
Ashwell, et al., Lower–Dimensional Systems and Molecular Electronics, vol B248, p. 647 (1991).
Geddes, et al., Appl. Phys. Lett. 56, 1916–1918 (1990).
Metzer, et al., J. Am. Chem. Soc. 119, 10455–10466 (1997).

*Primary Examiner*—Sara Crane
(74) *Attorney, Agent, or Firm*—Oblon, Spivak, McClelland, Maier & Neustadt, P.C.

(57) ABSTRACT

A unimolecular electrical rectifier is prepared by forming a metal electrode on a substrate such as silicon, glass or quartz. One or more organic monolayers are formed on the electrode by Langmuir-Blodgett film transfer methods, and the resulting organic layer is dried. The organic layer is super cooled to a temperature of about –200° C., to permit formation of a second electrode over the organic layer, without damaging the electrical properties of the organic layer. The two electrodes have the same composition, and the organic layer is a ground stage zwitteronic compound.

6 Claims, 1 Drawing Sheet

UNIMOLECULAR ORGANIC RECTIFIER OF ELECTRICAL CURRENT

BACKGROUND OF THE INVENTION

1. Field of the Invention

This invention pertains to unimolecular organic rectifiers, employing one or several layers of an organic molecule as a rectifier of electrical current, and methods of manufacturing the same, employing cryocooling of the formed organic layer to protect during deposition of a covering metal film, to provide an effective unimolecular rectifier.

BACKGROUND OF THE PRIOR ART

Unimolecular rectification of electrical current has been the focus of the computer industry for several years. Although expected to revolutionize that industry, application of unimolecular electrical rectifiers, referred to as the world's smallest telectronic devices, has been hampered by practical difficulties. In particular, the unimolecular layer suffers from weak formation on the metal electrodes, which causes the molecules to "turn around" in the presence of small voltages, under about one volt. In use, the molecules begin to tumble end over end to avoid the application of "high" electric fields.

Thus, while it was proposed in 1973 that a single organic molecule could be a rectifier of electrical current, Aviram. et al., Chem. Phys. Lett. 29, 277–283 (1974), this proposal was not verified for many years, despite drawing substantial attention. See, e.g., Metzger, Mater. Sci. & Eng. Rg. C3, 277–285 (1995). Sambles and co-workers used a Pt/multilayer/Mg/Al sandwich to find asymmetric currents through molecular multilayers. See, e.g., Geddes. et al., J. Appl. Phys. 71, 756–768 (1992) and Ashwell, et al. and Martin. et al., Phys. Rev. Lett. 70, 218–221 (1993).

Much of the difficulty encountered by Sambles and others is due to the fact that by using a variety of different metals, with different work functions on either side of the organic film, many different "Schottky barriers" could be formed, which mask and distort the electrical asymmetries due to the organic molecules themselves.

Nonetheless, uninolecular electronics are anticipated to revolutionize the computer industry, if the delicacy of the organic molecules employed in these inventions, under bias, can be addressed. These organic molecules are difficult to deposit onto metal electrodes, and their delicate electrical characteristics are easily damaged by the temperatures encountered in depositing a second electrode thereover.

Accordingly, it remains an object of those of skill in the art to provide an effective, reliable unimolecular electrical rectifier, and methods for fabricating the same.

SUMMARY OF THE INVENTION

The above objects, and others made more clear by the discussions set forth below, are achieved by the formation of a uninolecular organic rectifier using cryocooling to preserve the delicate electrical characteristics of the organic monolayer.

A conventional aluminum metal electrode is formed on silicon or other suitable substrate. This is conveniently achieved using a high-vacuum evaporator, or a film coater. Once the "bottom" electrode is formed, one or more layers of an organic molecule which preferably exhibits a ground-state zwitteronic electrical character, is deposited on top of the formed aluminum layer, through Langmuir-Blodgett film transfer. The formed organic layer is dried in a desiccator or evaporator, to eliminate water trapped between the aluminum layer and the organic layer(s), which will interfere with operation.

To preserve the delicate nature of the organic layer, the layer is cryocooled using liquid nitrogen, and then aluminum is deposited onto the cryocooled organic layer. Thereafter, contacts are formed connecting the two aluminum electrode layers, through eutectic contacts, to conductors such as gold wires.

DETAILED DESCRIPTION OF THE INVENTION

Figure 1:
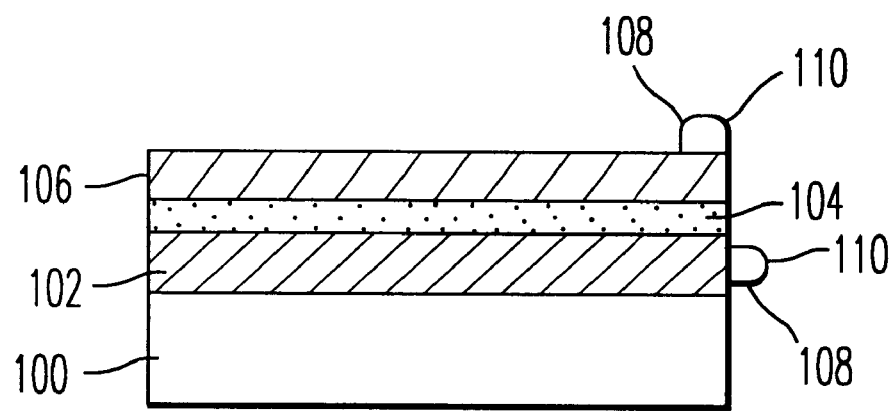
FIG. 1 is a cross-section of the unimolecular electrical rectifier of the claimed invention.

Much of the theoretical work that went into the development of this invention is explained, in detail, in Metzger, et al., J. Am. Chem. Soc. 119, 10455–10466 (1997). This reference is not prior art herein, describing the inventive work of the inventors, in pertinent portion herein. Nonetheless, because of its detailed disclosure of the theoretical basis for the invention, and prior art efforts, the entire disclosure of this article is incorporated herein by reference. It is noted that a novel and effective synthesis for a preferred zwitterionic ground state organic monolayer is provided, although the same compounds have been previously identified, Ashwell. et al., in Lower-Dimensional Systems and Molecular Electronics, Vol. B248, page 647 (1991) and Ashwell, Organic Materials for Non-Linear Optics, pages 31–39 (1993).

Because this invention calls for the formation of monolayers, and conveniently uses Langmuir-Blodgett film transfer (L-B herein), a ground state zwitterion, which can exhibit both one-electron donor and one-electron acceptor characteristics is preferred as the unimolecular organic layer. A variety of such compounds are known: dodecyloxyphenyl-carbamate-bromo (hydroxyethoxy) tetracyanoquinodimethane has been previously documented where the dodecyloxyphenyl moiety constituents is a weak one-electron donor and the tetracyanoquinodimethane moiety is a one-electron acceptor. Geddes. et al., Appl. Phys. Lett. 56, 1916–1918 (1990). A variety of acceptable zwitterionic molecules are set forth by Ashwell, supra. A quaternary picolinium or lepidinum halide, when reacted with an alkali salt of tetracyanoquinodimethane, yields an acceptable class of ground-state zwitterions, such as picolyltricyanoquinodimethane or picolinium tricyanoquinodimethanide. A particularly preferred zwitterionic molecule is hexadecylquinolinium tricyanoquinodimethanide, although other zwitterionic ground state molecules of this type, which can become donor and acceptor molecules, are acceptable.

The unimolecular rectifier of this invention is formed on a substrate, typically an inert substrate 100 such as silicon, glass or quartz. The preferred bottom electrode 102 is aluminum, although magnesium and other metals have also been used. Any high-vacuum evaporator, or film coater, can be used, such as the Edwards EL 306A evaporator, which uses a multi-source rotating stage. Although the formation of this layer is generally conventional, and a variety of conditions can be used, typical conditions employ a base pressure of $10^{-6}$ torr, with a distance from source to substrate of 20–25 cm.

Thereafter, one or more monolayers 104 of a ground-state zwitterionic molecule is transferred from the air-water interface to the exposed surface of the aluminum formed on the substrate, through L-B film transfer. Transfer speeds range from 15 mm min$^{-1}$ to 45 mm min$^{-1}$. At the lower speeds, the films are Z-type, while at higher speeds, the multilayers become Y-type, when depositing heyadecylquinolinium tricyanoquinodimethanide. L-B film transfer methods are known to those of skill in the art, and generally employed conditions are suitable herein.

After formation of the L-B layer, the substrate bearing the aluminum base electrode and the L-B film is dried. This is essential to remove any water trapped between the aluminum (electrode) layer and the organic layer(s). Drying for at least twenty-four hours in a evaporator or desiccator is employed. Preferably, the partially formed structure is dried for seventy-two hours in a desiccator in the presence of $P_2O_5$.

Prior art methods have employed differing metals for the electrodes on opposite side of the rectifying layer. This has led to difficulties in detecting actual rectification, and accordingly, if aluminum is used as the lower electrode, aluminum is used in the upper electrode 106, and similarly for magnesium or other electrodes. Importantly, conventional methods for deposition of these metals calls for relatively high temperatures, which alter the ground state of the organic monolayers, which are much more delicate than the metals sandwiching this crucial layer. Accordingly, the partially-formed device, bearing a substrate, electrode and an L-B film, is cryocooled using liquid nitrogen, to a temperature of approximately −200° C. The covering electrode is formed under these conditions.

Cryocooling formation of the sandwiching layer can be achieved by placing the organic layers face down on a liquid-nitrogen cooled copper slab sample holder in the Edwards 306A evaporator used for formation of the first layer, although other apparatus can be employed using similar devices. Whatever device is used to support the organic layer is cooled from a supply of liquid nitrogen or similar low temperature material, down to a temperature of −200° C. The sample rests on the cryocooled copper slab, and the vacuum system is again pumped down to a pressure of about $10^6$ Torr. A tungsten wire with pieces of Al wire, for formation of an aluminum covering pad or electrode, is electrically heated. Aluminum atoms are evaporated off the tungsten filament. The aluminum atoms are at a temperature between the melting point of aluminum (660° C.) and the boiling point of aluminum (2,057° C.). These are deposited onto the exposed surface of the organic film, and immediately cooled to nearly −200° C. At this temperature, the formation of the covering metal electrode does no damage to the organic film.

After formation of the electrode sandwich around the organic film, silver paint or Galium-indium or similar eutectic contacts 108 are formed, to permit connection of the bottom and top electrodes to conductors 110 such as gold wires.

Employing this method, an applying positive and negative bias to the unimolecular rectifier formed, rectification of electric current has been demonstrated. Metzger. et al., J. Am. Chem. Soc. 119, 10455–10466 (1997).

This invention has been described both generically, and by reference to specific example. The examples are not intended to be limiting, unless so indicated, and alternatives, particularly in terms of structure and composition, will occur to those of ordinary skill in the art without the exercise of inventive faculty. Such alternatives remain within the scope of the invention, unless specifically excluded by the recitation of the claims set forth below.

What is claimed is:

1. A molecular organic rectifier, comprising a first electrode;

an organic film including at least one monolayer of a zwitterionic ground state compound on the first electrode; and a second electrode on the organic film, wherein the first electrode and the second electrode comprise aluminum; and the second electrode is formed by cooling the organic film to a temperature of about −200° C. or colder to form a cryocooled organic film, and vapor depositing the second electrode on the cryocooled organic film.

2. The rectifier of claim 1, wherein the first electrode and the second electrode are connected to conductors of electricity through contacts formed on the first electrode and the second electrode.

3. The rectifier of claim 1, wherein the monolayer is formed by Langmuir-Blodgett (LB) film transfer.

4. The rectifier of claim 3, wherein the zwitterionic ground state compound is prepared by reacting a quaternary compound selected from the group consisting of a picolnium halide and a lepidinum halide with an alkali salt of tetracyanoquinodimethane.

5. The rectifier of claim 4, wherein the zwitterionic ground state compound is hexadecylquinolinium tricyanoquinomethanide.

6. A method of forming a unimolecular electrical rectifier, comprising forming a first electrode, forming at least one monolayer of a ground state zwitterionic organic compound on the first electrode, cooling at least one monolayer to a temperature of about −200° C. or colder, forming a second electrode on the at least one monolayer, and forming the rectifier of claim 1.

* * * * *